United States Patent [19]
Popplewell et al.

[11] Patent Number: 6,114,879
[45] Date of Patent: Sep. 5, 2000

[54] PHASE DETECTORS

[75] Inventors: Andrew Popplewell; Stephen Williams, both of Manchester, United Kingdom

[73] Assignee: Mitel Semiconductor Limited, Wiltshire, United Kingdom

[21] Appl. No.: 09/226,442

[22] Filed: Jan. 6, 1999

[30] Foreign Application Priority Data

Jan. 9, 1998 [GB] United Kingdom .................. 9800351

[51] Int. Cl.[7] ........................... H03D 13/00; G01R 25/00
[52] U.S. Cl. ................................. 327/3; 375/375
[58] Field of Search ................................. 327/2, 3, 8, 9, 327/10, 12, 147, 150, 156, 159, 163; 331/17; 375/373, 375, 376

[56] References Cited

U.S. PATENT DOCUMENTS

| | | | |
|---|---|---|---|
| 4,488,294 | 12/1984 | Christensen et al. | 370/84 |
| 5,757,868 | 5/1998 | Kelton et al. | 375/360 |
| 5,883,536 | 3/1999 | Patterson | 327/184 |
| 5,956,379 | 9/1999 | Tarleton | 375/376 |

*Primary Examiner*—My-Trang Nuton
*Attorney, Agent, or Firm*—Townsend and Townsend and Crew LLP

[57] ABSTRACT

A phase detector determines an error value dependent on the relative phase between a local oscillator signal, used as the system clock, and an input signal received over a PR (a, b, a) channel. The phase error value is used to control a phase locked loop (FIG. 1, not shown). The received signal is sampled at regular intervals dependent on the local oscillator signal. A threshold slicer 22 selects an ideal sample value for a sampling point by comparing the sampled value to three thresholds provided on respective ones of slicer threshold inputs 23, 24 and 25. A subtracter 27 determines a difference value corresponding to a difference between the ideal sample value and the actual sample value for that sampling point. A delay register 28 and a subtracter 29 operate to determine the sense of change to the current ideal sample value from an ideal sample value for a preceding sample point. An output of the subtractor is applied to the switching input of a switch, which thereby provides as an output signal either the difference value or the inverse of the difference value, provided by an inverter 32, dependent on the detected sense of change.

25 Claims, 3 Drawing Sheets

PHASE DETECTORS

FIELD OF THE INVENTION

The present invention relates to phase detectors and more particularly to phase detectors for determining an error value dependent on the relative phase between a local oscillator signal and an input signal received over a channel having a class of partial response denoted as PR(a, b, a).

BACKGROUND OF THE INVENTION

To recover data from noisy channels, such as for example magnetic data carriers having high data densities, it is known to class the write/read channel of the data carrier in accordance with a partial response characteristic which approximates to the frequency response characteristics of the channel, and the arrangement or design of a digital data recovery circuit is selected to optimise data recovery from a channel with that partial response characteristic. As the correct recovery of data is so dependent on how well the channel characteristics are matched by the form of data recovery circuit selected, it is common to provide an equaliser circuit on the input of the data recovery circuit to compensate for any difference between the actual and the approximated channel characteristics.

The data recovery circuit contains a phase-lock loop circuit arrangement which receives an analogue read signal, from the equaliser circuit if there is one, and operates to control an oscillator at the phase and an integer multiple frequency of components of interest of the incoming data stream. Signals generated by this oscillator are used to sample the incoming analogue signal at appropriate sampling points, from which samples data recovery is performed. Correct phase alignment of the oscillator signals and the components of interest of the analogue read signal are critical in performing correct data recovery.

To assist the phase lock loop circuit arrangement in achieving fast initial frequency and phase alignment, the data carrier will usually have one or more regions in which VFO field data has been intentionally written. The VFO field data is a regular data pattern which, when being read, provides an analogue signal which in approximately sinusoidal and periodic in nature. In using these data channels, it is known for the data to be encoded to contain a minimum of two consecutive like bits in the data stream, and the VFO field data may for example comprise a succession of pairs of like data bits.

It is widely appreciated that certain types of optical data carrier channels currently being investigated for development will have a response characteristic approximating that of equation (1).

$$F(D)=a+bD+aD^2 \quad \text{Eqn. (1)}$$

Here, a and b are constant coefficients and D is a unit delay operator. This type of channel can be referred to as a class of partial response PR(a, b, a) channel.

SUMMARY OF THE INVENTION

In accordance with a first aspect of the present invention, a phase detector, for determining an error value dependent on the relative phase between a local oscillator signal and an input signal received over a PR (a, b, a) channel, which received signal is arranged to be sampled at regular intervals, which intervals are dependent on the local oscillator signal, comprises:

means to select an ideal sample value for a sampling point;

means to determine a difference value corresponding to a difference between the ideal sample value and the actual sample value for that sampling point;

means to determine the sense of change to the ideal sample value from an ideal sample value for a preceding sample point; and means responsive to said sense of change and to said difference value to provide said error value.

The sign of the difference value may be operated on in dependence on the sense of change.

Such a phase detector may further comprise means responsive when the ideal sample value is equal to either a lowest or a highest ideal sample value to select the preceding phase error value as the phase error value for that sampling point. Advantageously, this phase detector further comprises means responsive when in a track mode and when the ideal sample value is equal to either of the lowest and the highest ideal sample values to select a predetermined fraction of a preceding phase error value as the phase error value. In this phase detector, said predetermined fraction may be one half.

The magnitude of the phase error value may be equal to the magnitude of the difference value.

In accordance with a second aspect of the present invention, a method of determining an error value dependent on the relative phase between a local oscillator signal and an input signal received over a PR (a, b, a) channel, which received signal is and sampled at regular intervals which are dependent on the local oscillator signal, comprises:

selecting an ideal sample value for a sampling point;

determining a difference value corresponding to a difference between the ideal sample value and the actual sample value for that sampling point.

determining the sense of change to the ideal sample value from an ideal sample value for a preceding sampling point; and providing said phase error value in dependence on said sense of change and on said difference value.

Here, the sign of the difference value may be operated on in dependence on the sense of change.

Such a method may further comprise selecting a preceding phase error value as the phase error value for a sampling point when the ideal sample value is equal to either of a lowest or a highest ideal sample value. Advantageously, this method further comprises selecting a predetermined fraction of a preceding phase error value as the phase error value when in a track mode and when the ideal sample value is equal to either of the lowest and the highest ideal sample values. Said predetermined fraction may be one half.

he magnitude of the phase error value may be equal to the magnitude of the difference value.

A third aspect of the present invention provides a phase-locked loop incorporating any of the above phase detectors.

BRIEF DESCRIPTION OF THE DRAWINGS

An embodiment of the present invention will now be described with reference to the accompanying drawings of which.

PREFERRED EMBODIMENT OF THE INVENTION

Figure 1:
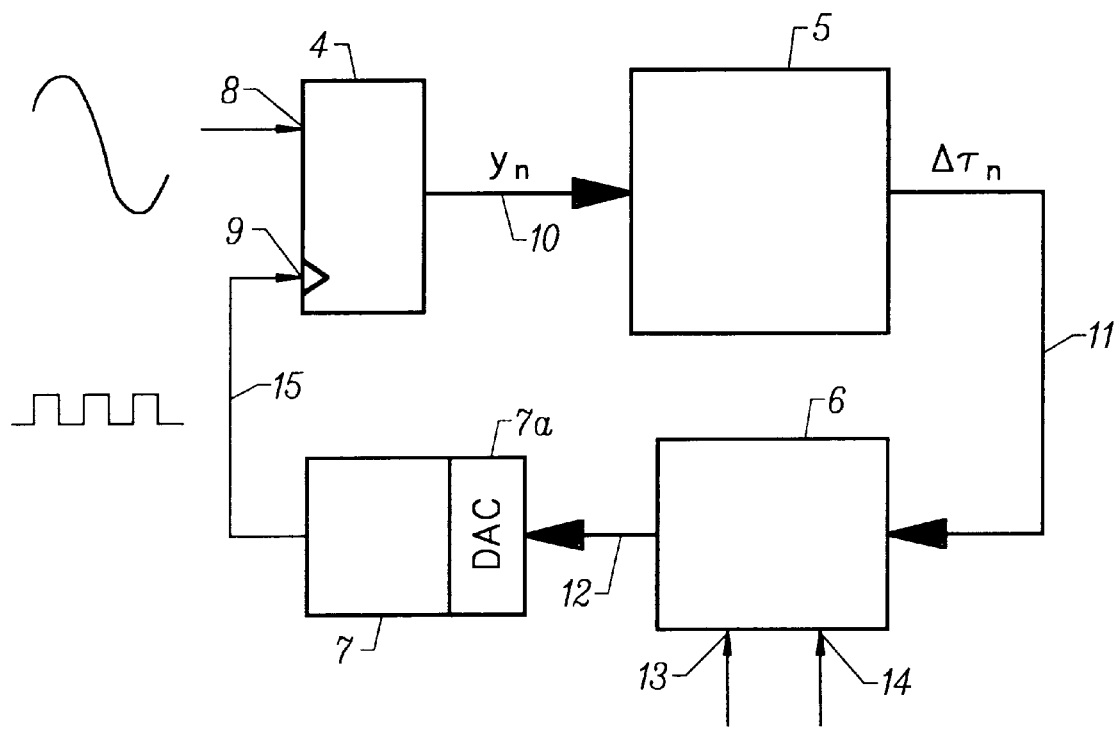
FIG. 1 shows a digital phase-lock loop incorporating a phase detector in accordance with the present invention.

Referring to FIG. 1, the digital phase lock loop comprises a flash analogue to digital convertor (ADC) 4, a digital phase detector 5, a digital loop filter 6 and a variable frequency oscillator (VFO) 7.

The ADC 4 receives an analogue read signal on an input terminal 8 and provides a digital value $Y_n$, representative of the amplitude of the read signal at the rising edge of a clock signal received on a clock input terminal 9, to the phase detector 5 on a first digital line 10. The phase detector provides a phase error value $\Delta\tau_n$, representative of a calculated difference between the actual phase of the clock signal and a desired phase, to the digital loop filter 6 on a second digital line 11. The digital filter 6 operates on the phase error value $\Delta\tau_n$ to provide a filtered phase error value to a digital to analogue converter 7A on the input of the VFO 7 on a third digital line 12. The frequency response of the filter 6 may be varied by application of different filter coefficients to coefficient input terminals 13 and 14. The VFO 7 provides a limited signal, having a phase and a frequency dependent on the value received on the third digital line 12, on a clock line 15 to the clock input terminal 9 of the ADC 4.

Figure 2:
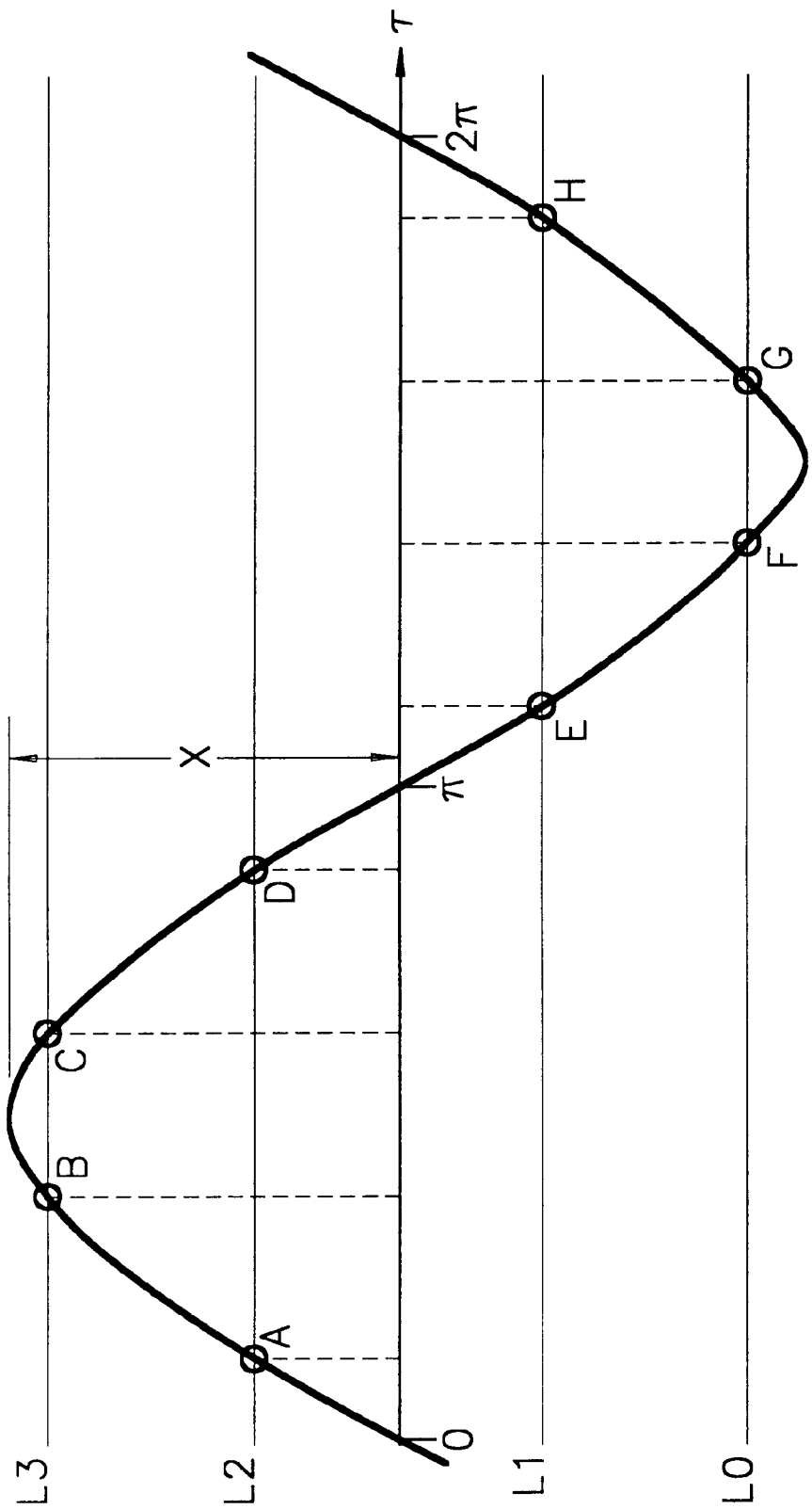
FIG. 2 shows an analogue VFO field data read signal and ideal sampling points thereof.

Referring now to FIG. 2, the VFO field data read signal 20 is shown having an approximately sinusoidal shape of amplitude X Volts and period $2\pi t$ seconds. First to eighth ideal sampling points A to H correspond to quarters of $\pi t$ from $\pi t/8$ to $15\pi t/8$ as shown, thus forming eight sampling points at regular intervals in the period of the signal 20.

When phase-locking and frequency-locking to the VFO field data read signal, the phase detector 5 of the present invention is set into an "acquisition" mode, in which the phase detector 5 performs the computation of Equation (2) to determine the sense of change of the amplitude of the input signal to the amplitude of the input signal at a sampling time t=n.

$$\text{grad=sign } (X_n - X_{n-1}) \qquad \text{Eqn (2)}$$

where $X_n$ is an ideal sample value at a time t=n and $X_{n-1}$ is an ideal sample value at the preceding sample time t=n-1. Following this computation, grad is +1 if $X_n > X_{n-1}$; -1 if $X_n < X_{n-1}$ and 0 if $X_n = X_{n-1}$. However, this calculation is made only for ideal sampling points on levels L1 and L2, with grad being made to zero for ideal sampling points on levels L0 and L3.

When grad is not equal to zero, the computation of equation (3) is performed.

$$\Delta\tau_n = \text{grad } (Y_n - X_n) \qquad \text{Eqn (3)}$$

where:

$\Delta\tau_n$ is a phase error value at time t=n, $Y_n$ is a sample value at time t=n, and $X_n$ is the ideal sample value at time t=n.

When grad is equal to zero, the phase detector 5 determines the phase error value as in Equation (4)

$$\Delta\tau_n = \Delta\tau_{n-1} \qquad \text{Eqn. (4)}$$

The result of these calculations is that for all sample points where the gradient of the read signal 20 is not equal to zero, i.e. sample points A, D, E and H, the value of the phase error value is proportional to the difference between the actual sample value and the ideal sample value at time t=n. Thus, a new phase error value $\Delta\tau_n$ may be calculated four times in the period of the VFO field data read signal 20.

Figure 3:
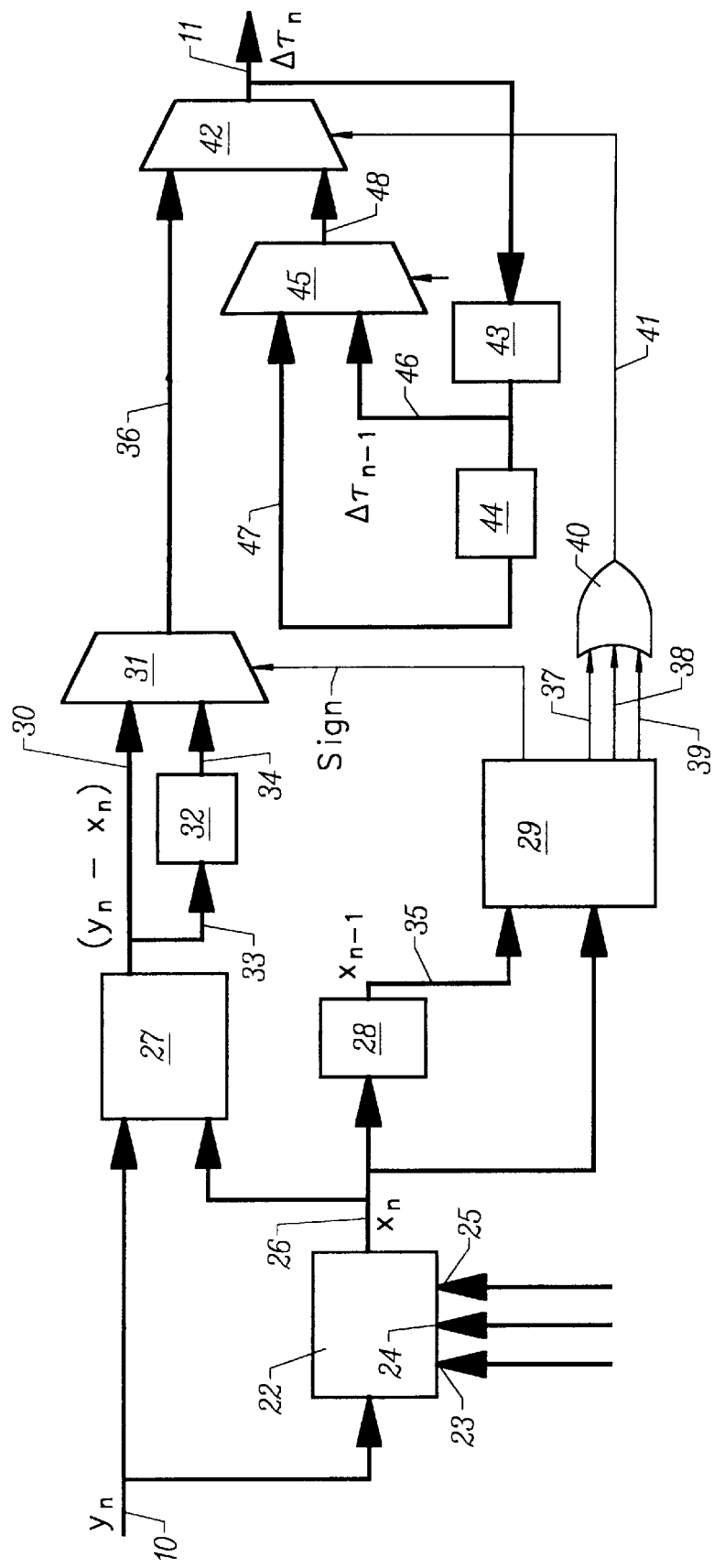
FIG. 3 shows the phase detector of FIG. 1.

The phase detector 5 is shown in detail in FIG. 3, in which the first digital line 10 and the second digital line 11 are six bit digital lines, thus allowing each of $Y_n$ and $\Delta\tau_n$ to assume a decimal value in the range of −32 to +31.

The value of $Y_n$ on the digital line 10 is examined by a data slicer 22, which then determines the ideal sample value. This determination is made by digitally comparing $Y_n$ to three thresholds provided on slicer threshold inputs 23, 24 and 25. The threshold provided on the input 23 corresponds to the mean value of L0 and L1, the threshold on the input 24 corresponds to the mean value of L1 and L2, and the threshold provided on the input 25 corresponds to the mean value of L2 and L3. By examining which of the thresholds are exceeded by $Y_n$, the data slicer 22 determines which of the levels L0, L1, L2 and L3 $Y_n$ is most similar to in value, and provides the value so determined on a further digital line 26 as $X_n$.

Alternatively, the data slicer 22 may use knowledge of the value of $Y_n$ received on preceding clock cycles to estimate where in the period of the read signal 20 the present sample value relates to, and determine $X_n$ using extrapolation of preceding values of a and examination of the current value of $Y_n$. This alternative may provide a phase detector 5 which is less likely to determine an incorrect value of $X_n$ in the face of a noisy read signal 20.

The digital line 26 carries the value of $X_n$ provided by the data slicer 22 to a subtracter device 27, to a delay register 28 and to a second subtracter 29.

The subtracter device 27 digitally subtracts $X_n$, received on the line 26, from $Y_n$, received on the line 10, to determine the difference between their values, and provides the difference value $Y_n - X_n$ on a further digital line 30. A digital switch 31 receives both the difference value from the subtracter 27 and the inverse of the difference value from an inverter device 32 which, in effect, inverts the sign of the value $Y_n - X_n$ on a branch 33 of the line 30 and provides the result to the digital switch on a line 34.

The delay register 28 provides on a further digital line 35 the value of $X_n$ on the preceding clock cycle, i.e. $X_{n-1}$, which is then subtracted from the value of $X_n$ by the subtracter 29. The sign of the result of this subtraction, which is the calculation of Equation (2), is provided to a switch control input of the digital switch 31 as the sense of change to the ideal sample value from the preceding ideal sample value. Thus, a positive result from the Equation (2) calculation causes the $Y_n - X_n$ value from the line 30 to be provided on a further digital line 36, and a negative result from the Equation (2) calculation causes the inverse value to be provided on the line 36. The switch 31 thus performs the calculation of Equation (3), operating on the difference value in response to the sense of change to provide a phase error value. Where the subtraction of $X_{n-1}$ from $X_n$ results in zero, i.e. there is no sign, it is unimportant what signal is provided to the switching input of the switch 31, as will be understood from the description below.

The subtracter 29 also compares the value of $X_n$ received on the line 26 to the value of L0, providing a logical 1 signal on an output 37 if the values are the same, and to the value of L3, providing a logical 1 signal on a second output 38 if the values are the same. Also, if the data slicer 22 is of the type first described above, the subtracter 29 compares also the value of $X_n$ to the value of $X_{n-1}$ and provides a logical 1 signal on a further output 39 if the values are the same. An or gate 40 provides a logical 1 output signal on a line 41 if a logical 1 signal is detected on any of the outputs 37, 38 and 39, and a logical 0 output signal otherwise.

The output line 41 of the or gate 40 is connected to the switch control input of a further digital switch 42. The value on the digital line 36, which is the result of the Equation (3) calculation, is passed as $\Delta\tau_n$ onto the output digital line 11 of the switch 42 when a logical 0 signal is present on the line 41. When $X_n$=LO or L3, or $X_n$=$X_{n-1}$ the logical 1 signal on the line 41 causes the switch 42 to pass as $\Delta\tau_n$ onto the line 11 a value provided by a feedback circuit comprising a further delay register 43, a divide by two device 44 and a further digital switch 45. The delay register 43 receives the value of $\Delta\tau_n$ from the digital line 11 and provides the value of $\Delta\tau_n$ on the preceding clock cycle; i.e. $\Delta\tau_n$, on a further digital line 46 to both of an input of the switch 45 and an input of the divide by two device 44. The divide by two device 44 provides one half of the $\Delta\tau_n$ value to the other input of the switch 45 on a further digital line 47.

Whether the switch 45 passes the value from the divide by two device 44 or the value from the delay register 43 to the second input of the switch 42 on a further digital line 48 depends on the logic signal applied to the control switch input of the switch 45. Preferably a mode device (not shown) provides a logical 1 signal to the control switch input of the switch 45, thereby providing the output value of the delay register 43 to the switch 42, when the phase-lock loop of FIG. 1 is in acquisition mode, and provides a logical 0 signal to the switch control input of the switch 45 when in a track mode.

In this way, because the value of $\Delta\tau_n$ is held from the preceding clock cycle when $X_n$=LO, L3 or $X_{n-1}$ rapid lock can be achieved when reading VFO field data. When in a track mode, the holding of the value of $\Delta\tau_n$ from the preceding clock cycle could cause the phase-lock loop to become unlocked when the read signal contains a significant number of consecutive like bits. To avoid this situation, the mode device (not shown) switches the digital switch 42 to receive values from the divide by two device 44. In this way, the "valid" value of $\Delta\tau_n$, i.e. the previous term calculated from a sample value where the or gate 40 provided a logical O output signal, is successively divided by two for every sample time instance, until the value of $\Delta\tau_n$ eventually dwindles to zero, or a "valid" value of $\Delta\tau_n$ occurs.

What is claimed is:

1. A phase detector, for determining an error value dependent on the relative phase between a local oscillator signal and an input signal received over a PR (a, b, a) channel, which received signal is arranged to be sampled at regular intervals, which intervals are dependent on the local oscillator signal, comprising:
   means to select an ideal sample value for a sampling point;
   means to determine a difference value corresponding to a difference between the ideal sample value and an actual sample value for that sampling point;
   means to determine a sense of change to the ideal sample value from a second ideal sample value for a preceding sample point; and
   means responsive to said sense of change and to a difference value to provide said phase error value.

2. A phase detector in accordance with claim 1, in which the sign of the difference value is operated on in dependence on the sense of change.

3. A phase detector in accordance with claim 2, further comprising means responsive when the ideal sample value is equal to either a lowest or a highest ideal sample value to select the preceding phase error value as the phase error value for that sampling point.

4. A phase detector in accordance with claim 3, further comprising means responsive when in a track mode and when the ideal sample value is equal to either of the lowest and the highest ideal sample values to select a predetermined fraction of a preceding phase error value as the phase error value.

5. A phase detector in accordance with claim 4, in which said predetermined fraction is one half.

6. A phase detector in accordance with claim 2, in which the magnitude of the phase error value is equal to the magnitude of the difference value.

7. A phase detector in accordance with claim 3, in which the magnitude of the phase error value is equal to the magnitude of the difference value.

8. A phase detector in accordance with claim 1, further comprising means responsive when the ideal sample value is equal to either a lowest or a highest ideal sample value to select a preceding phase error value as the phase error value for that sampling point.

9. A phase detector in accordance with claim 8, further comprising means responsive when in a track mode and when the ideal sample value is equal to either of the lowest and the highest ideal sample values to select a predetermined fraction of a preceding phase error value as the phase error value.

10. A phase detector in accordance with claim 9, in which said predetermined fraction is one half.

11. A phase detector in accordance with claim 9, in which the magnitude of the phase error value is equal to the magnitude of the difference value.

12. A phase detector in accordance with claim 8, in which the magnitude of the phase error value is equal to the magnitude of the difference value.

13. A phase detector in accordance with claim 1, in which the magnitude of the phase error value is equal to the magnitude of the difference value.

14. A method of determining an error value dependent on the relative phase between a local oscillator signal and an input signal received over a PR (a, b, a) channel, which received signal is sampled at regular intervals which are dependent on the local oscillator signal, comprising:
   selecting an ideal sample value for a sampling point;
   determining a difference value corresponding to a difference between the ideal sample value and an actual sample value for that sampling point.
   determining a sense of change to the ideal sample value from a second ideal sample value for a preceding sampling point; and
   providing said phase error value in dependence on said sense of change and on said difference value.

15. A method in accordance with claim 14, in which the sign of the difference value is operated on in dependence on the sense of change.

16. A method in accordance with claim 15, further comprising selecting a preceding phase error value as the phase error value for a sampling point when the ideal sample value is equal to either of a lowest or a highest ideal sample value.

17. A method in accordance with claim 16, further comprising selecting a predetermined fraction of a preceding phase error value as the phase error value when in a track mode and when the ideal sample value is equal to either of the lowest and the highest ideal sample values.

18. A method in accordance with claim 17, in which said predetermined fraction is one half.

19. A method in accordance with claim 14, further comprising selecting a preceding phase error value as the phase error value for a sampling point when the ideal sample value is equal to either of a lowest or a highest ideal sample value.

20. A method in accordance with claim 19, further comprising selecting a predetermined fraction of a preceding phase error value as the phase error value when in a track mode and when the ideal sample value is equal to either of the lowest and the highest ideal sample values.

21. A method in accordance with claim 20, in which said predetermined fraction is one half.

22. A method in accordance with claim 19, in which the magnitude of the phase error value is equal to the magnitude of the difference value.

23. A method in accordance with claim 14, in which the magnitude of the phase error value is equal to the magnitude of the difference value.

24. A method in accordance with claim 15, in which the magnitude of the phase error value is equal to the magnitude of the difference value.

25. A method in accordance with claim 17, in which the magnitude of the phase error value is equal to the magnitude of the difference value.

* * * * *